United States Patent [19]
Shulman

[11] Patent Number: 6,064,258
[45] Date of Patent: May 16, 2000

[54] DISTRIBUTED GAIN LINE DRIVER AMPLIFIER

[75] Inventor: Dima David Shulman, Marlboro, N.J.

[73] Assignee: Lucent Technologies Inc., Murray Hill, N.J.

[21] Appl. No.: 09/299,237

[22] Filed: Apr. 23, 1999

[51] Int. Cl.$^7$ .............................. H03F 1/02; H03F 3/45; H03F 3/68; H03F 3/60

[52] U.S. Cl. .............................. 330/9; 330/253; 330/295; 330/54

[58] Field of Search .............................. 330/9, 253, 295, 330/286, 54

[56] References Cited

U.S. PATENT DOCUMENTS

| | | |
|---|---|---|
| 4,446,445 | 5/1984 | Apel . |
| 4,486,719 | 12/1984 | Ayasli . |
| 4,701,716 | 10/1987 | Poole . |
| 4,788,511 | 11/1988 | Schindler . |
| 4,888,559 | 12/1989 | Sevenhans et al. ...................... 330/253 |
| 5,166,635 | 11/1992 | Shih ........................................ 330/295 |
| 5,550,513 | 8/1996 | Wong . |
| 6,011,417 | 12/1989 | Ezell et al. .................................. 330/9 |

*Primary Examiner*—Robert Pascal
*Assistant Examiner*—Patricia T. Nguyen

[57] ABSTRACT

A line driver amplifier is implemented by employing amplifier stages including a plurality of output transistors and a corresponding plurality of auxiliary amplifiers. The output transistor and auxiliary amplifier pairs are connected in parallel. Each of the auxiliary amplifiers includes a built in voltage offset, beginning with an auxiliary amplifier having the smallest voltage offset to the auxiliary amplifier having the largest offset. The individual auxiliary amplifiers maintain their corresponding output transistors in an OFF state so long as the overall amplifier input signal has a magnitude less than the auxiliary amplifier offset voltage level. When the input signal magnitude level is equal to or greater than the offset voltage level of an auxiliary amplifier, that auxiliary amplifier turns its corresponding output transistor to an ON state. Thus, for lower magnitude input signals fewer than all of the output transistors are in an ON state, while for maximum magnitude input signals all of the output transistors are in an ON state. Use of the auxiliary amplifier-output transistor pairs allows use of smaller size transistors, each of which has a lower output current than an equivalent single output transistor. Since all of the output transistors in each amplifier stage are connected in parallel, the amplifier output current is the sum of the currents passing through the ON output transistors. Consequently, the linearity of the overall amplifier structure is significantly improved in the frequency domain. In one embodiment of the invention the auxiliary amplifier offset voltage levels are fixed, while in another embodiment of the invention the offset voltage levels of the auxiliary amplifiers are adjustable, e.g., programmable.

42 Claims, 3 Drawing Sheets

100

300

303, 305

500

DISTRIBUTED GAIN LINE DRIVER AMPLIFIER

RELATED APPLICATION

U.S. patent application Ser. No. 09/299,142 was filed concurrently herewith.

TECHNICAL FIELD

This invention relates to amplifiers and, more particularly, to distributed gain line driver amplifiers.

BACKGROUND OF THE INVENTION

Line driver amplifiers remain a bottleneck in modern analog circuit design. Their integration with other analog circuit components is problematic. One reason for this is that the need to employ relatively large magnitude supply voltages prevents realizing the advantages that would result from using finer and much faster integrated circuit technology. Other reasons include large power consumption, and sensitivity to noise coming from power supplies and the integrated circuit substrate. Indeed, a properly designed line driver amplifier should have well-controlled quiescent currents in its output transistors along with the ability to provide much larger magnitude currents during the transient state. Additionally, in many applications the line driver amplifier distortion characteristics at high frequencies are very important.

In prior known line driver amplifier arrangements the transconductance of the amplifier output transistor changes with current. Consequently, the amplifier bandwidth is dependent on the output transistor current. This results in dynamic distortion in the amplifier output causing non-linearity in the frequency domain.

SUMMARY OF THE INVENTION

These and other problems and limitations of prior known line driver amplifiers are addressed by employing amplifier stages each including a plurality of output transistors and a corresponding plurality of auxiliary amplifiers. The output transistor and auxiliary amplifier pairs are connected in parallel. Each of the auxiliary amplifiers includes a built in voltage offset, beginning with an auxiliary amplifier having the smallest voltage offset to the auxiliary amplifier having the largest offset. The individual auxiliary amplifiers maintain their corresponding output transistors in an OFF state so long as the overall amplifier input signal has a magnitude less than the auxiliary amplifier offset voltage level. When the input signal magnitude level is equal to or greater than the offset level of an auxiliary amplifier, that auxiliary amplifier turns its corresponding output transistor to an ON state. Thus, for lower magnitude input signals fewer than all of the output transistors are in an ON state, while for maximum magnitude input signals all of the output transistors are in an ON state. Use of the auxiliary amplifier-output transistor pairs allows use of smaller size transistors, each of which has a lower output current than an equivalent single output transistor. Since all of the output transistors in each amplifier stage are connected in parallel, the amplifier output current is the sum of the currents passing through the ON output transistors. Consequently, the amplifier bandwidth is less dependent on output transistor current and the dynamic linearity of the overall amplifier structure is significantly improved in the frequency domain.

In one embodiment of the invention the auxiliary amplifier offset voltage levels are fixed, while in another embodiment of the invention the offset voltage levels of the auxiliary amplifiers are adjustable, e.g., programmable.

DETAILED DESCRIPTION

Note that in the following example, the transistors are shown as field effect transistors (FETs), however the invention may be advantageously employed with other semiconductor device transistor elements. Thus, for simplicity and clarity of exposition the FETs will hereinafter be referred to as "transistors".

Figure 1:
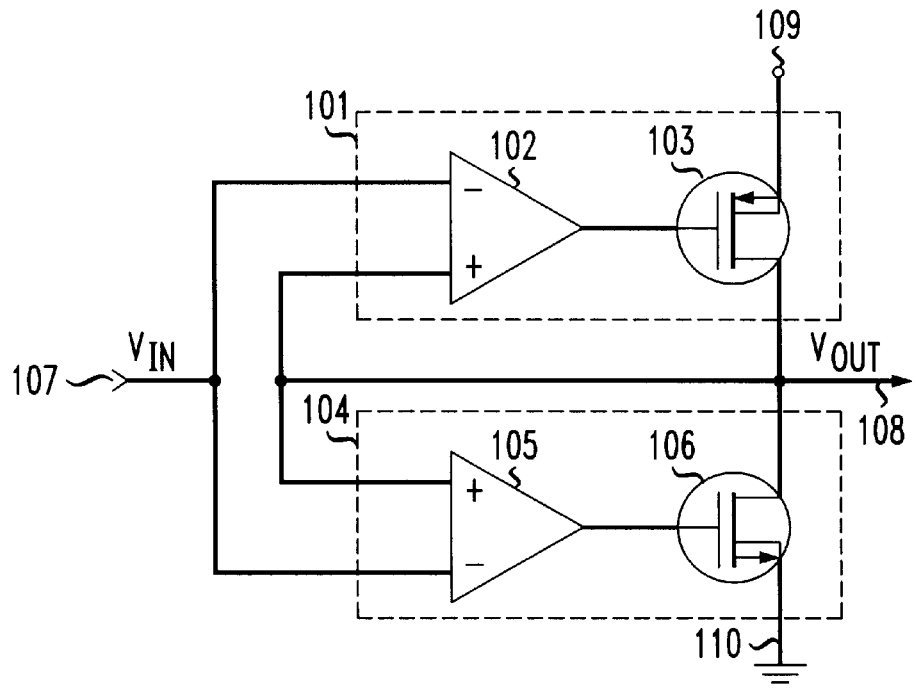
FIG. 1 shows, in simplified block diagram form, details of a prior known line driver amplifier.

FIG. 1 shows, in simplified block diagram form, details of a typical output stage of a prior known line driver amplifier 100. Amplifier 100 is a so-called symmetrical amplifier of a type well known in the art including two similar output stages. One amplifier stage 101 includes auxiliary amplifier 102 and output transistor 103 and the other amplifier stage 104 includes auxiliary amplifier 105 and output field effect transistor 106. Amplifier stage 101 is connected between amplifier 100 input terminal 107, output terminal 108 and supply voltage terminal 109. Amplifier stage 104 is connected between input terminal 107, output terminal 108 and ground potential terminal 110. Note that output transistor 103 is a "p" type and that output transistor 106 is an "n" type, otherwise amplifier stages 101 and 104 are essentially identical. Since the amplifier 100 stages 101 and 104 are essentially identical only stage 101 will be discussed in detail.

This prior amplifier 100 is attractive because of its linearity (due to feedback) and its ability to provide large magnitude output voltage swings. In order to improve the linearity of amplifier 100 at high frequencies, the unity gain bandwidth of its amplifier stages, for example, amplifier stage 101 including auxiliary amplifier 102 and output transistor 103, should be maximized.

The transfer function of amplifier 102 is given by:

$$A(s) = \frac{A_0}{1 + s\tau}, \quad (1)$$

where $1/\tau$ is the dominant pole frequency.

The transfer function of amplifier stage 101 is given by:

$$\frac{V_{OUT}}{V_{IN}} = \frac{1}{1 + s\tau/A_0 gm_{OUT} R_L}, \quad (2)$$

where $gm_{OUT}$ is the transconductance of the output transistor 103, and $R_L$ is the load impedance. This transfer function is valid for very small output loads (50 Ω or less), so that the Miller effect is not significant, i.e., there is no capacitive coupling between the auxiliary amplifier 102 output and output transistor 103 output. The output transistor 103 would normally carry low quiescent currents (typically 100 $\mu$A -1 mA), while the peak current can be 100–400 mA.

Figure 2:
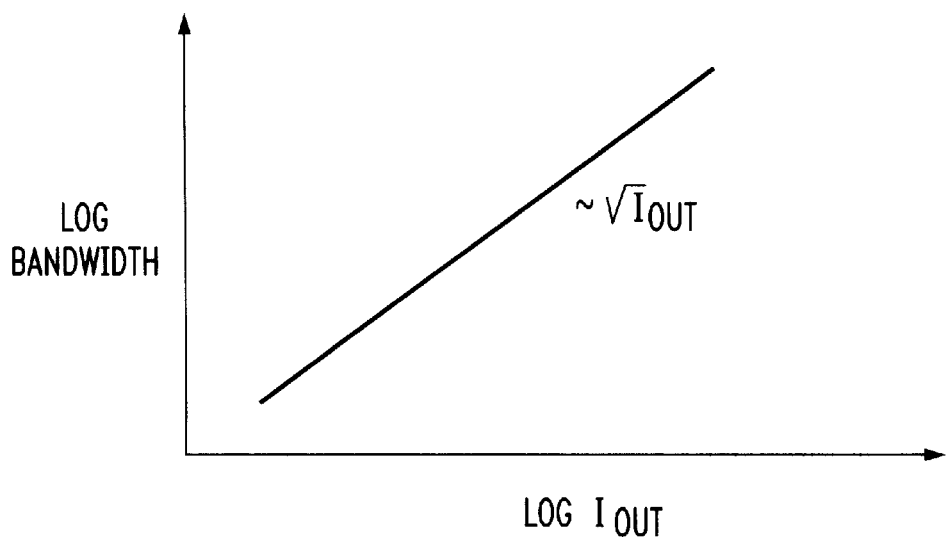
FIG. 2 graphically illustrates a bandwidth versus output transistor current characteristic for the amplifier of FIG. 1.

FIG. 2 graphically illustrates a bandwidth versus output transistor current characteristic for the amplifier of FIG. 1. Since $gm_{OUT}$ of the output transistors of the amplifier shown in FIG. 1 changes with current, the bandwidth of (delay through) the output stage is signal dependent as shown by the bandwidth versus output transistor current (Iout) characteristic in FIG. 2. This results in dynamic distortion of the output stage. The capacitive load of the auxiliary amplifier is determined mainly by the gate capacitance Cgs of the output transistor for very small resistive output load impedances. For a prescribed maximum voltage level requirement on a prescribed resistive load impedance, for a given CMOS technology, the output transistor 103 size and its Cgs is determined. The resulting transfer function for amplifier stage 101 is:

$$\frac{V_{OUT}}{V_{IN}} = \frac{1}{1 + sCgs/gm_{IN}gm_{OUT}R_L}, \quad (3)$$

where $gm_{IN}$ is the transconductance of the amplifier 102.

Equation 3 indicates that optimizing the frequency response of the transfer function amounts to optimizing Ft=Cgs/gm of the output transistor 103. The ratio Ft can be shown to be:

$$Ft \propto \sqrt{\frac{I}{WL^3}}, \quad (4)$$

where W, L and I are the width, length and current, respectively, of the output transistor. In order to maximize Ft, for a prescribed current requirement and channel length L of the output transistor, the width W of the channel should be minimized. Since the prior line driver amplifier 100 is operating with different output voltage levels and its output transistor 103 is designed to deliver the maximum voltage level, the channel width W is oversized, and the frequency response of the line driver amplifier 100 is not optimized.

Figure 3:
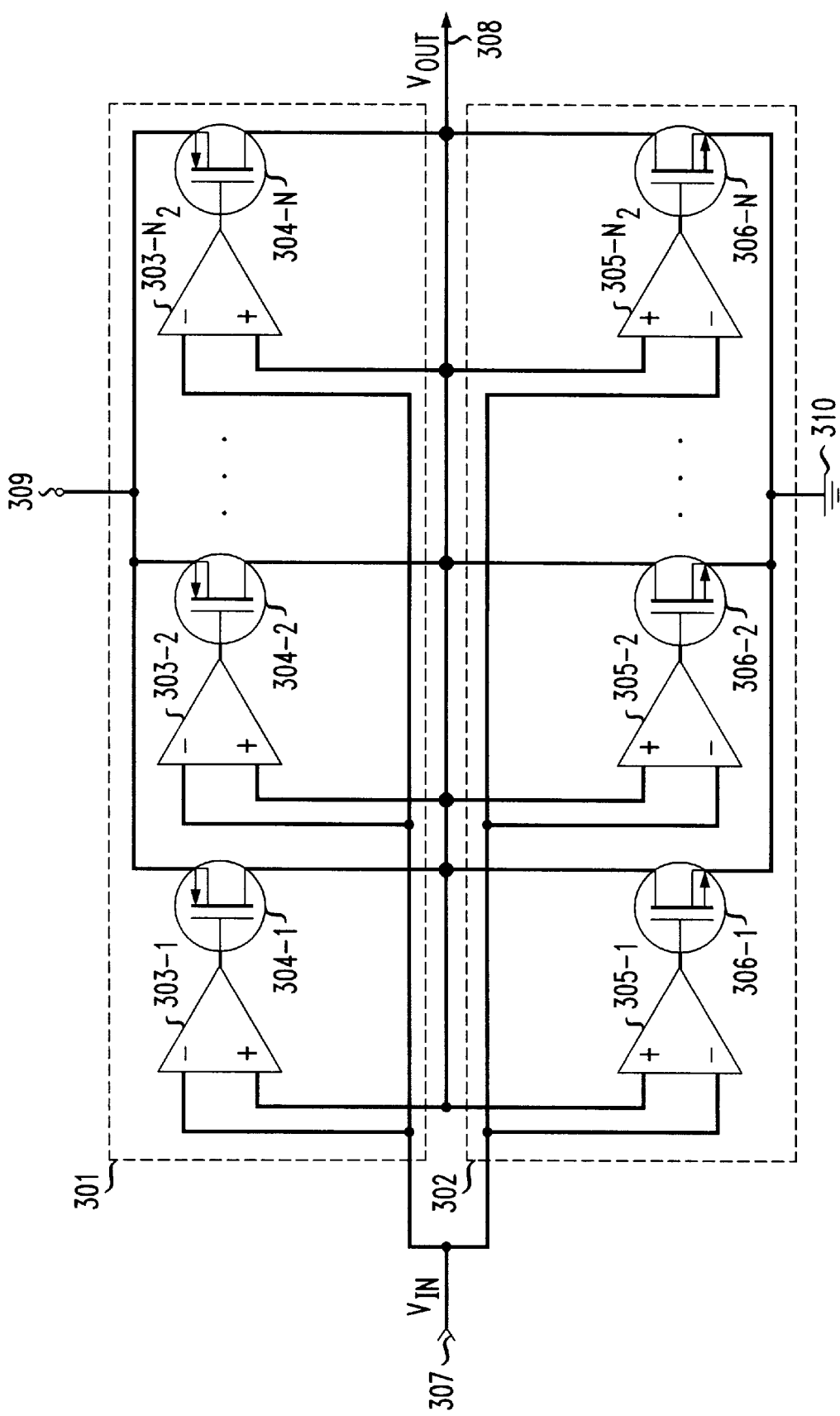
FIG. 3 shows, in simplified block diagram form, details of a line drive amplifier including an embodiment of the invention.

FIG. 3 shows, in simplified block diagram form, details of a line drive amplifier 300 including an embodiment of the invention. Specifically, shown is amplifier 300 including two amplifier stages 301 and 302. Amplifier stage 301 includes a plurality of auxiliary amplifiers 303-1 through 303-N and their associated output transistors 304-1 though 304-N, respectively, connected in parallel. Similarly, amplifier stage 302 includes auxiliary amplifiers 305-1 through 305-N and their output transistors 306-1 through 306-N, respectively, connected in parallel. Each of auxiliary amplifiers 303 and 305, in this example, includes a differential amplifier having first and second inputs and an output and has a "built-in", i.e., internally generated, offset voltage. The differential amplifiers are designed such as to provide a particular offset voltage, as will be described below regarding FIG. 4. A first input of each of auxiliary amplifiers 303 and 305 is connected to amplifier 300 input terminal 307, while a second input of auxiliary amplifiers 303 and 305 is connected to amplifier 300 output terminal 308. Similarly, an output from each of auxiliary amplifiers 303-1 through 303-N is connected to a gate terminal of associated output transistors 304-1 through 304-N, respectively. A source terminal of each of output transistors 304 is connected to supply voltage terminal 309, while the drain terminal of each of output transistors 304 is connected to output terminal 308. Similarly, an output from each of auxiliary amplifiers 305-1 through 305-N is connected to a gate terminal of associated output transistors 306-1 through 306-N, respectively. A source terminal of each of output transistors 306 is connected to terminal 310, which in this example is ground potential, while the drain terminal of each of output transistors 306 is connected to output terminal 308. As shown, in this example, output transistors 304 are "n" type field effect transistors fabricated in CMOS technology. Similarly, in this example, output transistors 306 are "n" type field effect transistors also fabricated in CMOS technology.

It is noted that auxiliary amplifiers 303-1 through 303-N and their associated output transistors 304-1 through 304-N, respectively, are connected in parallel between the amplifier 300 input terminal 307, supply voltage terminal 309 and amplifier 300 output terminal 308. Again, auxiliary amplifiers 305-1 through 305-N and their associated output transistors 306-1 through 306-N, respectively, are connected in parallel between amplifier 300 input terminal 307, ground potential terminal 310 and amplifier 300 output terminal 308. Since, a plurality of output transistors 304 and 306 are employed in amplifier stages 301 and 302, respectively, in accordance with the invention, the individual output transistors can be smaller in size than otherwise would be required if a single output transistor would have been used per amplifier stage as was done in prior line driver amplifiers. In this example, line driver amplifier 300 is implemented in integrated circuit form using CMOS technology. Additionally, in this example, auxiliary amplifiers 303 and 305 are arranged in sequence according to their individual built-in offset voltage. Thus, auxiliary amplifiers 303-1 and 305-1 each have the smallest desired offset voltage, while auxiliary amplifiers 303-N and 305-N have the largest desired offset voltage. The intermediate ones of auxiliary amplifiers 303 and 305 have offsets voltages that are determined by the circuit implementers, as desired. In this manner auxiliary amplifiers 303 and 305 maintain their associated output transistors 304 and 306, respectively, in an OFF state as long as the input signal magnitude supplied to terminal 307 is less than the auxiliary amplifier offset voltage. When the magnitude of the input signal supplied to input terminal 307 reaches or exceeds the offset voltage of the auxiliary amplifier (amplifiers) it drives its (they drive their) associated output transistor(s) into an ON state. Thus, one or more of output transistors 304 and one or more of output transistors 306 may be in an ON state. When the input signal magnitude is equal to or greater than the largest offset voltage, all of the output transistors are driven into the ON state and participate in delivering the amplifier 300 output current. Referring to equation 4, it is noted that for a given output current requirement and output transistor channel length, L, the channel width, W, should be minimized. This is realized in the above described embodiment of the invention by the use of the plurality of smaller channel width output transistors, and wherein only those output transistors are in an ON state dependent on the magnitude of the input signal. That is, for smaller input signal magnitudes fewer output transistors are in an ON state than for larger input signal magnitudes. Thus, in this manner, the effective width, W, of an equivalent transistor to the plurality of output transistors becomes proportional to the amplifier 300 output current I, and Ft is equal and maximized for all input signals levels, in accordance with the invention.

It should be noted that this multi-auxiliary amplifier and multi-output transistor embodiment of the invention increases the linearity of overall line driver amplifier 300 in the frequency domain. However, there is a tradeoff between the number of auxiliary amplifier and output transistor stages to be used and performance of amplifier 300. Therefore, only a marginal improvement in performance can be expected, once a prescribed number of auxiliary amplifier stages has been employed, with the use of additional auxiliary amplifier and output transistor stages.

Figure 4:
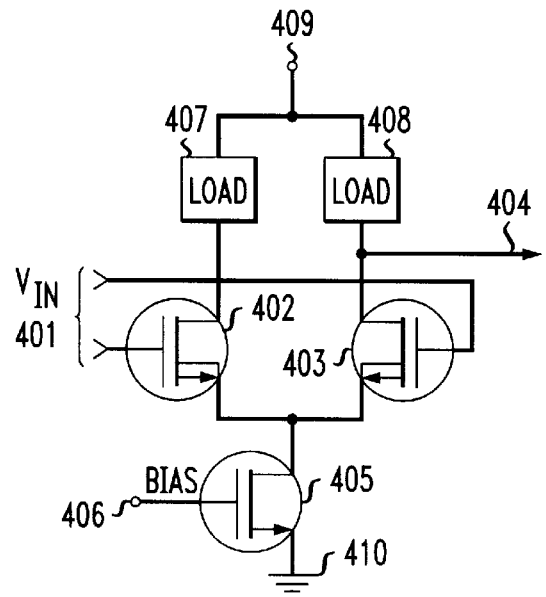
FIG. 4 shows, in simplified form, details of a differential amplifier including a built-in offset voltage level which may be employed in the auxiliary amplifiers used in the line driver amplifier of FIG. 3.

FIG. 4 shows, in simplified form, details of a differential amplifier including a built-in offset voltage level which may be employed in the auxiliary amplifiers 303 or 305 used in the line driver amplifier of FIG. 3. An input signal is supplied across input terminals 401 to gate terminals of field effect transistors 402 and 403. Transistors 402 and 403 are connected along with load impedances 407 and 408 and bias field effect transistor 405 in the well known differential pair amplifier configuration between supply voltage terminal 409 and, in this example, ground potential terminal 410. A bias voltage is applied via bias terminal 406 to the gate terminal of transistor 405 to set the operating current of the differential amplifier, in well known fashion.

As indicated above each of auxiliary amplifiers 303 and 305 has a built-in offset voltage level. This offset voltage level is obtained by causing transistors 402 and 403 to have a current mismatch. In order to control the offset voltage level, the current mismatch between transistors 402 and 403 should be larger than the threshold mismatch between the transistors. Thus, for the same gate-source terminal voltage across the transistor 402 and 403, the current mismatch will be proportional to the ratios W/L of the channels of transistors 402 and 403, where W is the channel width and L is the channel length. Indeed, the resulting current mismatch causes a desired deviation in the output voltage at output 404 relative to the voltage when transistors 402 and 403 are symmetrical. Thus, resulting in a desired offset voltage level, in accordance with the invention. Note that in practice, it is advantageous to have the channel at a fixed length L and only adjust the channel width W to obtain the desired current mismatch between transistors 402 and 403 and, hence the amplifier offset voltage.

Figure 5:
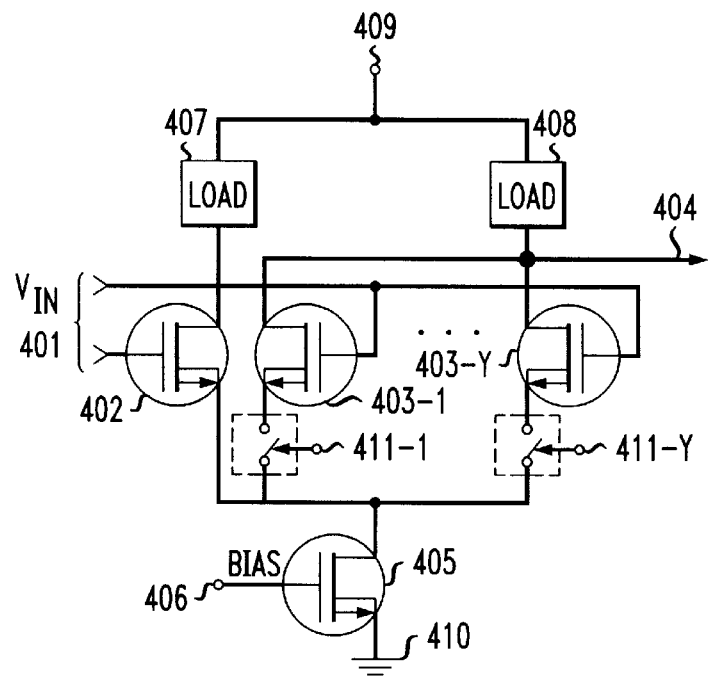
FIG. 5 shows, in simplified form, details of a differential amplifier having a programmable offset voltage level.

FIG. 5 shows, in simplified form, details of a differential amplifier having a programmable offset voltage level which may advantageously be employed in the auxiliary amplifiers used in the embodiment of the invention shown in FIG. 3. Elements that similar in operation and functionality to those used in the differential amplifier shown in FIG. 4 and described above, have been similarly numbered and will not be discussed in detail here. Thus, shown are a plurality of field effect transistors 403-1 through 403-Y which have different channel areas relative to each other and to the channel area of transistor 402. Then, to obtain a desired offset voltage level a particular one or more of transistors 403-1 through 403-Y are controllable switched via controllable switches 411-1 through 411-Y, respectively, into the second leg of the differential amplifier 500 as transistor 403 of FIG. 4. The reasons that a desired offset voltage results have been described above relative to the differential amplifier shown in FIG. 4 and are equally applicable to differential amplifier 500 of FIG. 5.

The above-described arrangements are, of course, merely illustrative of the principles of the invention. Indeed, numerous other arrangements may be devised by those individuals skilled in the art without departing from the spirit and scope of the invention. For example, it may be desirable to employ output transistors of various sizes rather than all the same size depending upon the specific application or upon attaining a desired response characteristic. Moreover it is envisioned that the invention will be implemented in a so-called balanced amplifier configuration. How to realize such a balance amplifier configuration will be apparent to those possessing ordinary skill in the art.

What is claimed is:

1. An amplifier including at least a first amplifier stage, the at least first amplifier stage comprising:
    a first plurality of auxiliary amplifiers, each of said auxiliary amplifiers in said first plurality having an input and an output and including a prescribed offset voltage level; and
    a first plurality of output transistors, each of said output transistors in said first plurality being in a prescribed circuit relationship with the output of a respective one of said first plurality of auxiliary amplifiers forming a first plurality of auxiliary amplifier-output transistor pairs that are connected in parallel circuit relationship with each other, wherein each of said output transistors in said first plurality of output transistors is in an OFF state until an input signal supplied to the inputs of said first plurality of auxiliary amplifiers has a signal magnitude equal to or greater than the offset voltage level of the respective auxiliary amplifier in circuit relationship to said respective output transistor, whereby linearity in the frequency domain of said amplifier is improved.

2. The invention as defined in claim 1 wherein said offset voltages of said first plurality of auxiliary amplifiers are set at values so that additional ones of said first plurality of output transistors are driven into an ON state with increased magnitude of said input signal.

3. The invention as defined in claim 2 wherein when said input signal has a magnitude less than a prescribed minimum value all of said first plurality of output transistors are in an OFF state and when said input signal has a magnitude greater than a prescribed maximum value all of said first plurality of output transistors are in an ON state.

4. The invention as defined in claim 3 wherein each of said first plurality of output transistors is smaller in size and carries less current when in an ON state than that of an equivalent single output transistor, if said equivalent single transistor were to be used in place of said first plurality of output transistors.

5. The invention as defined in claim 4 wherein each of said first plurality of output transistors is a field effect transistor having a channel, said channel including a channel width (W) and a channel length (L) and wherein an effective width of an equivalent transistor to said first plurality of output transistors is substantially minimized and is proportional to an output current (I) of said amplifier, whereby linearity in the frequency domain of said amplifier is improved.

6. The invention as defined in claim 5 wherein $$Ft = Cgs/gm \propto \sqrt{\frac{I}{WL^3}},$$

where Cgs is the gate to source capacitance of said equivalent output transistor, gm is the transconductance of the equivalent output transistor, W, L and I are the width, length and current of said equivalent output transistor and wherein Ft is equal and substantially maximized for a prescribed range of said input signal magnitudes.

7. The invention as defined in claim 1 wherein each of said first plurality of auxiliary amplifiers has a prescribed internally generated offset voltage.

8. The invention as defined in claim 7 wherein said offset voltage of each of said first plurality of auxiliary amplifiers is controllably selectable.

9. The invention as defined in claim 7 wherein said offset voltage of each of said first plurality of auxiliary amplifiers has a voltage value different than said offset voltages for others of said first plurality of auxiliary amplifiers.

10. The invention as defined in claim 9 wherein each of said first plurality of auxiliary amplifiers includes at least one differential pair of first and second transistors and said offset voltage is generated by causing a current mismatch flowing through said first transistor relative to said second transistor.

11. The invention as defined in claim 10 wherein said current mismatch is obtained by the size of said first transistor being different from the size of said second transistor.

12. The invention as defined in claim 10 wherein each of said first and second transistor has a channel including a channel length (L) and a channel width (W), and wherein said current mismatch between said first and second transistors is obtained by setting a ratio of said channel width to said channel length (W/L) of said first transistor to be different form a ratio of said channel width to said channel length (W/L) for said second transistor.

13. The invention as defined in claim 10 wherein said first and second transistors are field effect transistors.

14. The invention as defined in claim 13 wherein said amplifier is implemented as an integrated circuit using CMOS technology.

15. The invention as defined in claim 1 further including a second amplifier stage, said second amplifier stage being connected in circuit with said first amplifier stage wherein said amplifier is arranged as a symmetrical amplifier.

16. The invention as defined in claim 15 wherein said second amplifier stage includes a second plurality of auxiliary amplifiers, each of said auxiliary amplifiers in said second plurality having an input and an output and including a prescribed offset voltage level, and a second plurality of output transistors, each of said output transistors in said second plurality being in a prescribed circuit relationship with the output of a respective one of said second plurality of auxiliary amplifiers forming a second plurality of auxiliary amplifier-output transistor pairs that are connected in parallel circuit relationship with each other, wherein each of said output transistors in said second plurality of output transistors is in an OFF state until an input signal supplied to the inputs of said second plurality of auxiliary amplifiers has a signal magnitude equal to or greater than the offset voltage level of the respective auxiliary amplifier in circuit relationship to said respective output transistor, whereby linearity in the frequency domain of said amplifier is improved.

17. The invention as defined in claim 16 wherein said offset voltages of said first and second plurality of auxiliary amplifiers are set at values so that additional ones of said first and second pluralities of output transistors are driven into an ON state with increased magnitude of said input signal.

18. The invention as defined in claim 17 wherein when said input signal has a magnitude less than a prescribed minimum value all of said first and second pluralities of output transistors are in an OFF state and when said input signal has a magnitude greater than a prescribed maximum value all of said first and second plurality of output transistors are in an ON state.

19. The invention as defined in claim 18 wherein each of said first and second pluralities of output transistors is smaller in size and carries less current when in an ON state than that of an equivalent single output transistor, if a first equivalent single transistor were to be used in place of said first plurality of output transistors and if a second equivalent single transistor were to be used in place of said second plurality of output transistors.

20. The invention as defined in claim 19 wherein each output transistor of said first and second pluralities of output transistors is a field effect transistor having a channel, said channel including a channel width (W) and a channel length (L) and wherein an effective width of a first equivalent transistor to said first plurality of output transistors and a second equivalent transistor to said second plurality of output transistors is substantially minimized and is proportional to an output current (I) of said amplifier, whereby linearity in the frequency domain of said amplifier is improved.

21. The invention as defined in claim 20 wherein $$Ft = Cgs/gm \propto \sqrt{\frac{I}{WL^3}},$$

where Cgs is the gate to source capacitance of said equivalent output transistor, gm is the transconductance of the equivalent output transistor, W, L and I are the width, length and current of said equivalent output transistor and wherein Ft is equal and substantially maximized for a prescribed range of said input signal magnitudes.

22. The invention as defined in claim 16 wherein each auxiliary amplifier of said first and second pluralities of auxiliary amplifiers has a prescribed internally generated offset voltage.

23. The invention as defined in claim 22 wherein said offset voltage of each of said first plurality of auxiliary amplifiers is controllably selectable.

24. The invention as defined in claim 22 wherein said offset voltage of each of said auxiliary amplifiers of said first and second pluralities of auxiliary amplifiers has a voltage value different than said offset voltages for others of said first plurality of auxiliary amplifiers and said second plurality of auxiliary amplifiers, respectively.

25. The invention as defined in claim 23 wherein each auxiliary amplifier of said first plurality and second pluralities of auxiliary amplifiers includes at least one differential pair of first and second transistors and said offset voltage is generated by causing a current mismatch flowing through said first transistor relative to said second transistor.

26. The invention as defined in claim 25 wherein said current mismatch is obtained by the size of said first transistor being different from the size of said second transistor.

27. The invention as defined in claim 25 wherein each of said first and second transistor has a channel including a channel length (L) and a channel width (W), and wherein said current mismatch between said first and second transistors is obtained by setting a ratio of said channel width to said channel length (W/L) of said first transistor to be different form a ratio of said channel width to said channel length (W/L) for said second transistor.

28. The invention as defined in claim 25 wherein said first and second transistors are field effect transistors.

29. The invention as defined in claim 28 wherein said amplifier is implemented as an integrated circuit using CMOS technology.

30. An amplifier including at least a first amplifier stage, the at least first amplifier stage comprising:
   a first plurality of auxiliary amplifier means, each of said auxiliary amplifier means in said first plurality having an input and an output and for providing a prescribed offset voltage level; and a first plurality of output transistor means, each of said output transistor means in said first plurality being in a prescribed circuit relationship with the output of a respective one of said first plurality of auxiliary amplifier means forming a first plurality of auxiliary amplifier-output transistor pairs that are connected in parallel circuit relationship with each other and for providing an output current component when in an ON state, wherein each of said output transistor means in said first plurality of output transistor means is in an OFF state until an input signal supplied to the inputs of said first plurality of auxiliary amplifier means has a signal magnitude equal to or greater than the offset voltage level of the respective auxiliary amplifier means in circuit relationship to said respective output transistor means, whereby linearity in the frequency domain of said amplifier is improved.

31. The invention as defined in claim 30 wherein said offset voltages of said first plurality of auxiliary amplifier means are set at values so that additional ones of said first plurality of output transistor means are driven into an ON state with increased magnitude of said input signal.

32. The invention as defined in claim 31 wherein each of said first plurality of output transistor means is smaller in size and carries less current when in an ON state than that of an equivalent single output transistor means, if said equivalent single transistor means were to be used in place of said first plurality of output transistor means.

33. The invention as defined in claim 30 wherein each of said first plurality of auxiliary amplifiers has a prescribed internally generated offset voltage.

34. The invention as defined in claim 33 wherein said offset voltage of each of said first plurality of auxiliary amplifiers is controllably selectable.

35. The invention as defined in claim 33 wherein said offset voltage of each of said first plurality of auxiliary amplifiers has a voltage value different than said offset voltages for others of said first plurality of auxiliary amplifiers.

36. The invention as defined in claim 30 further including a second amplifier stage, said second amplifier stage being connected in circuit with said first amplifier stage wherein said amplifier is arranged as a symmetrical amplifier.

37. The invention as defined in claim 36 wherein said second amplifier stage includes a second plurality of auxiliary amplifier means, each of said auxiliary amplifier means in said second plurality having an input and an output and for providing a prescribed offset voltage level, and a second plurality of output transistor means, each of said output transistor means in said second plurality being in a prescribed circuit relationship with the output of a respective one of said second plurality of auxiliary amplifier means forming a second plurality of auxiliary amplifier-output transistor pairs that are connected in parallel circuit relationship with each other and for providing an output current component when in an ON state, wherein each of said output transistor means in said second plurality of output transistor means is in an OFF state until an input signal supplied to the inputs of said second plurality of auxiliary amplifier means has a signal magnitude equal to or greater than the offset voltage level of the respective auxiliary amplifier mans in circuit relationship to said respective output transistor means, whereby linearity in the frequency domain of said amplifier is improved.

38. The invention as defined in claim 37 wherein said offset voltages of said first and second plurality of auxiliary amplifier means are set at values so that additional ones of said first and second pluralities of output transistor means are driven into an ON state with increased magnitude of said input signal.

39. The invention as defined in claim 38 wherein each of said first and second pluralities of output transistor means is smaller in size and carries less current when in an ON state than that of an equivalent single output transistor means, if a first equivalent single transistor means were to be used in place of said first plurality of output transistor means and if a second equivalent single transistor means were to be used in place of said second plurality of output means.

40. The invention as defined in claim 37 wherein each auxiliary amplifier means of said first and second pluralities of auxiliary amplifier means has a prescribed internally generated offset voltage.

41. The invention as defined in claim 40 wherein said offset voltage of each of said first plurality of auxiliary amplifier means is controllably selectable.

42. The invention as defined in claim 40 wherein said offset voltage of each of said auxiliary amplifier means of said first and second pluralities of auxiliary amplifier means has a voltage value different than said offset voltages for others of said first plurality of auxiliary amplifier means and said second plurality of auxiliary amplifier means, respectively.

* * * * *